United States Patent [19]

Lundgren et al.

[11] 4,079,337

[45] Mar. 14, 1978

[54] WIDE BANDWIDTH FEEDBACK AMPLIFIER

[75] Inventors: Kenneth Paul Lundgren, Arlington Heights; Edward John Freeman, Lombard, both of Ill.

[73] Assignee: Motorola, Inc., Schaumburg, Ill.

[21] Appl. No.: 736,927

[22] Filed: Oct. 29, 1976

[51] Int. Cl.² .................. H03F 3/14; H01C 1/012
[52] U.S. Cl. ............................. 330/307; 330/109; 338/308; 357/51
[58] Field of Search .......... 330/38 M, 109; 338/308; 357/51; 427/101, 103

[56] References Cited

U.S. PATENT DOCUMENTS

| | | | |
|---|---|---|---|
| 3,289,093 | 11/1966 | Wanlass | 357/51 X |
| 3,568,127 | 3/1971 | Aimi | 338/308 X |
| 3,896,284 | 3/1974 | Holmes | 338/308 X |

Primary Examiner—Lawrence J. Dahl
Attorney, Agent, or Firm—Margaret Marsh Parker; James W. Gillman

[57] ABSTRACT

A wide bandwidth characteristic is provided for use as in a negative feedback amplifier by a deposited resistor arrangement. The arrangement includes a basic feedback resistor having a high resistance value and a narrow elongated shape. Closely positioned on the same substrate and physically parallel are one or more low value resistors having the same length and with adjacent points on the respective resistors being at the same electrical potential. The feedback capacitance is greatly reduced by the extra length. The capacity to ground, and thus the displacement current, is essentially eliminated since most of the stray capacitance is between points of equal potential.

16 Claims, 10 Drawing Figures

U.S. Patent   March 14, 1978   Sheet 2 of 2   4,079,337
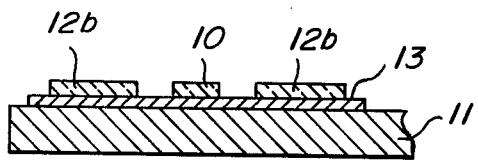
Fig. 4
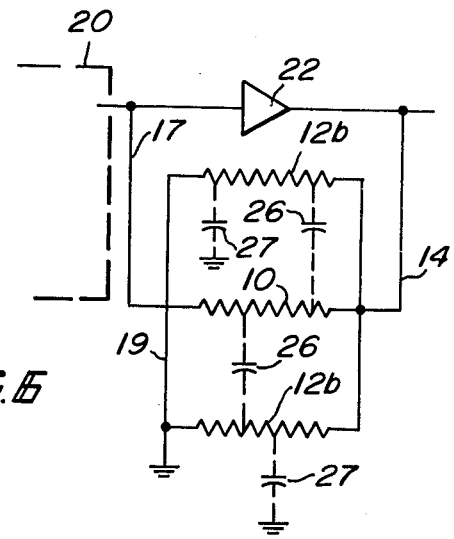
Fig. 6
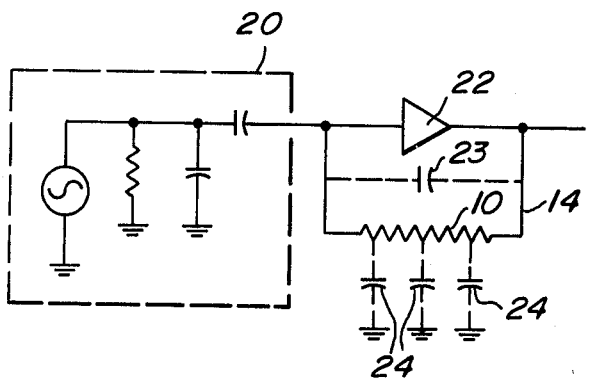
PRIOR ART
Fig. 5
Fig. 7A
PRIOR ART
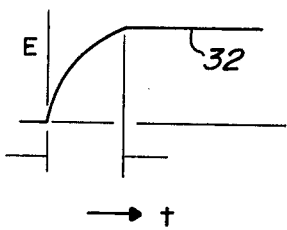
Fig. 7B
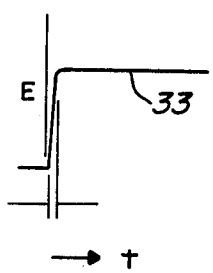

WIDE BANDWIDTH FEEDBACK AMPLIFIER

BACKGROUND OF THE INVENTION

This invention relates to the field of wide bandwidth resistors, particularly as used in negative feedback amplifiers, and more particularly to thick film, deposited resistors in a conformation providing broad bandwidth along with high signal-to-noise ratio.

In an application such as a negative feedback amplifier where broad bandwidth is required, a fraction of the amplifier output is added to the input in phase opposition. When properly done, the amplification becomes substantially independent of the amplifier characteristics, the non-linear distortion produced in the amplifier is reduced, and the signal-to-noise ratio is greatly improved.

Negative feedback amplifiers as customarily used may be limited in bandwidth by the characteristics of the feedback resistor, since there is zero phase shift only in the frequency range for which the resistor remains purely resistive. With discrete resistors or known deposited resistors, high frequency rolloff is a limiting factor because of feedback capacitance and distributed capacity to ground.

In certain applications, it may be required to amplify very small currents coming from a high impedance source, such as 200 nanoamperes and 100 megohms. The feedback resistor provides a low input impedance for the amplifier so that the source capacitance will not limit the bandwidth. A high value resistor is required because of the small signal current.

SUMMARY OF THE INVENTION

It is an object of this invention to provide a broad bandwidth resistor having a high ohmic value for use at radio frequencies.

It is a particular object to provide such a high value resistor as for use in a negative feedback amplifier.

It is another particular object to provide such a resistor in deposited film form.

The above objects are achieved in accordance with the invention by forming two or more deposited film resistors having the same length, but different resistive values, on a substrate, very close together and in physically parallel conformation. The primary resistor, such as might couple a fraction of an amplifier's output back to its input, has a high resistance value and is made extra long to reduce to a minimum the feedback capacitance across the leads. The distributed capacitance, which would otherwise be to ground, is essentially eliminated by coupling the added low resistance value resistor or resistors to essentially the same potentials as the feedback resistor. In an amplifier, this could be done by connecting the "amplifier output" end of the feedback resistor to the adjacent end of the added resistor, and connecting the other end of the added resistor to a reference potential which is essentially equal to the potential at the "amplifier input". Thus, the distributed stray capacitance of the feedback resistor is almost entirely between points of equal potential and has no effect on the bandwidth. The stray capacitance of the low value resistor to ground also cannot effect the bandwidth.

BRIEF DESCRIPTION OF THE DRAWING

In the drawing:

FIG. 4 is a cross-sectional view of the embodiment of FIG. 2, taken along the line 4—4.

FIG. 5 is an equivalent circuit of the prior art.

FIG. 6 is an equivalent circuit in accordance with the invention.

FIGS. 7A and 7B are waveforms indicating rise times of the circuits of the prior art and the invention respectively.

DETAILED DESCRIPTION OF A PREFERRED EMBODIMENT

It is to be noted that all of the resistors to be described hereinafter may be formed according to any of the techniques known in the art of deposited resistors. In the simplest terms, this includes an insulating base, a deposition of strips of a material having a relatively high resistance, and a deposition of a highly conductive material for connection purposes. The base may be an alumina substrate. The resistive material may be a suspension of conductive metal particles in a glass or ceramic matrix which is deposited on the substrate by the silk screen method and fired at a high temperature. The conductive material may be gold or silver deposited by an electroless process. Interconnection leads are attached to the layers of conductive material. The above information is intended to be instructive only and is not intended to limit the scope of the invention to be described. It is also to be noted that the drawings are illustrative only and are not drawn to scale.

Figure 1A:
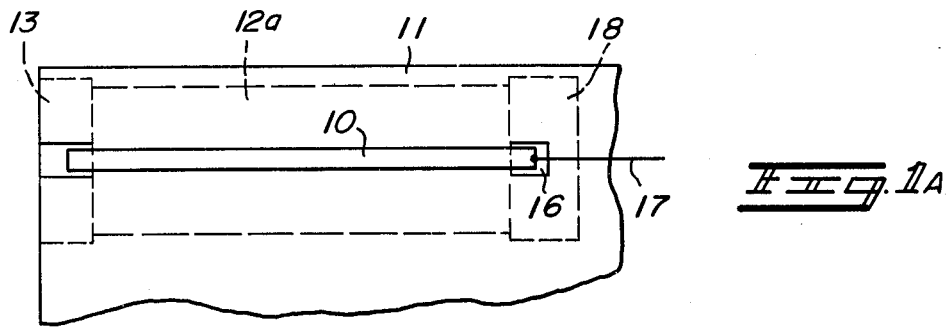
FIGS. 1A and 1B are plan views of the front and back respectively of a preferred embodiment.
Figure 1B:
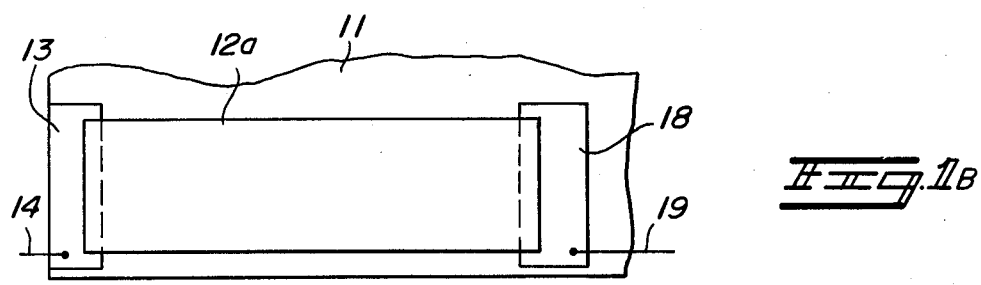

FIGS. 1A and 1B show one embodiment of the invention having a "guarded" resistor 10 on a first surface of the substrate 11 and a relatively wide "guard" resistor 12a on the opposite surface of the substrate (indicated by dashed lines in FIG. 1A for clarity). The meaning of "guard" and "guarded" as used in this description will be explained hereinafter in relation to FIG. 6.

Figure 2:
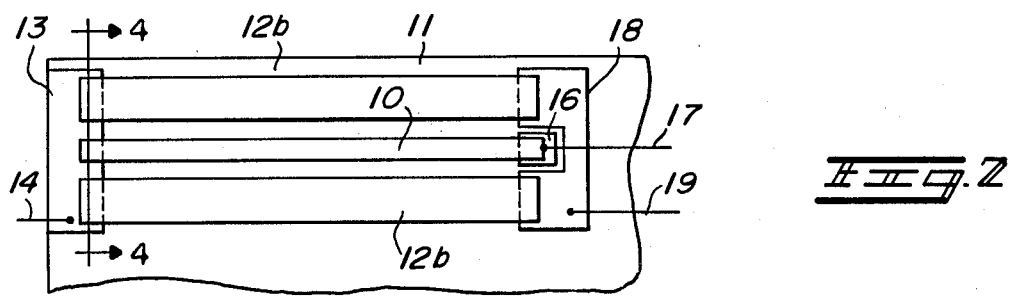
FIG. 2 is a plan view of another preferred embodiment.
Figure 3A:
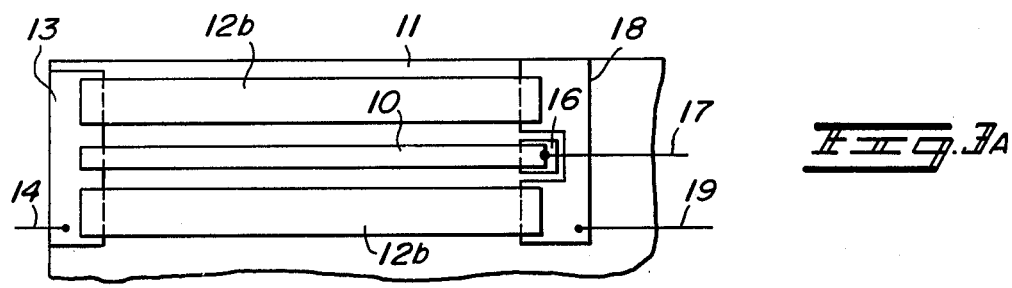
FIGS. 3A and 3B are plan views of still another preferred embodiment.
Figure 3B:
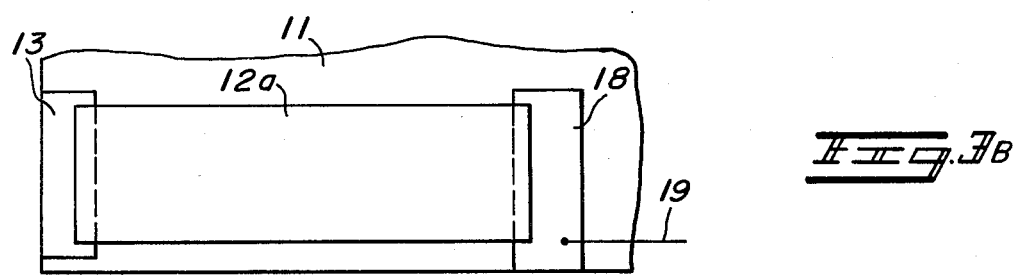

FIG. 2 shows the resistor 10 and two guard resistors 12b on a single surface of the substrate 11. FIGS. 3A and 3B show the front and back of the substrate 11 in an embodiment having the resistor 10 and including all three guard resistors 12a and 12b.

In each of the above embodiments, all of the resistors are tied together at one end with a common conductive layer 13 which may be on only one side of the substrate as in FIG. 2 or wrapped around an edge of the substrate as in FIGS. 1 and 3. The common conductor 13 may be coupled by a lead 14 to an amplifier output as described hereinafter. The opposite end of the guarded resistor 10 is connected to a conductive layer 16 which may be coupled to an amplifier input by a lead 17. The opposite ends of the guard resistors 12a and/or 12b in all figures are connected to a conductive layer 18 which is coupled to ground or to a reference voltage by a lead 19.

FIG. 4 is a cross-sectional view of the embodiment of FIG. 2, illustrating a preferred conformation of the substrate 11, the resistors 10 and 12b, and the conductive layer 13. Typical dimensions for the width of the resistor 10 might be 0.05 inches (0.127 centimeters), the width of the resistor 12a might be 0.3 inches (0.76 centimeters), the width of the resistor 12b might be 0.1 inches (0.25 centimeters), the spacing between resistors might be 0.025 inches (0.06 centimeters), and the length of each might be 1.2 inches (3 centimeters).

FIG. 5 is a schematic diagram of the prior art showing a signal current source 20 such as an operational amplifier in equivalent circuit form, and having a low impedance or "equivalent ground" output. The signal source 20 inputs to an amplifier 22. The amplifier 22 is a negative feedback amplifier having forward gain of −A with no feedback and with a fraction B of the output returned to the input for stability and low signal to noise ratio over the frequency range where 1 − AB > 1. It can be shown that where AB is large, the gain of the amplifier 22 becomes independent of A and approaches the reciprocal of B. When the feedback voltage is developed by a purely resistive network, B has no phase angle and is, therefore, independent of frequency. Thus the amplifier will have negligible phase shift for all frequencies for which AB is large. In the prior art, the bandwidth limiting factors are a feedback capacitance ($C_f$) 23 and a distributed capacity to ground ($C_d$) 24. For example, if the feedback path is resistor 10, having a value of 600,000 ohms, a bandwidth extending to 10 MHz would require a value of $C_f \leq \frac{1}{2}\pi fR =$ 0.027pf. A single discrete 600,000 ohm carbon composition resistor, for example, might have a $C_f$ value of around 0.3pf and a $C_d$ of between 0.1 and 0.2pf. If the resistor is made longer to reduce $C_f$, $C_d$ increases accordingly.

In FIG. 6, the signal source 20 inputs to the amplifier 22 and the feedback resistor 10 is coupled from the output to the input of the amplifier 22 as before, but the guard resistors 12a are also coupled to the output of the amplifier 22 with their opposite ends coupled to ground. As used in this description, "guarded" means protected from stray capacitance to ground, and "guarded resistor" indicates an element providing the protection. In order to provide this function, the resistors 10 and 12 must be placed very close together throughout their entire lengths, whether on the same side of the substrate or on opposite sides and their respective lengths must be substantially identical. All of the resistors should preferably vary linearly over their respective lengths, but it is required that each increment of length of the guard resistor comprise substantially the same percentage of its total resistance as the immediately opposite increment of length of each guard resistor comprises of its respective total resistance. When these restrictions are met, essentially all stray capacitance of the guarded resistor 10 is to the guard resistors 12a and/or 12b, as represented in FIG. 6 by capacitors 26. Since this capacitance is effectively between points of equal signal potential, there is no effect on the frequency response of the feedback circuit. Stray capacitance between the guard resistors 12b and ground is represented by capacitors 27. Since the resistors 12a and 12b are relatively low in resistance value, the capacitance to ground has no deleterious effect.

FIGS. 7A and 7B show voltage rise times through a feedback resistor of the prior art and the resistor of the present invention respectively, with identical square wave inputs and drawn to the same scale. It may be clearly seen that the prior art has a bandwidth limiting effect, and the resistor of the invention does not.

Thus, there has been provided, in accordance with the invention, a deposited resistor conformation providing a wide bandwidth characteristic for many applications. A negative feedback amplifier is one such application, and has been used as illustrative of the advantages and characteristics of the broadband resistor, but no limitation thereto should be inferred.

What is claimed is:

1. An improved feedback resistor arrangement for providing a wide band characteristic in a negative feedback amplifier having input and output terminals and a reference terminal having thereon a signal substantially equal to that on the input terminal, said feedback resistor arrangement including in combination:
   a substrate;
   first elongated resistor means deposited on the substrate, having first and second ends coupled to the output and input terminals respectively and having a first resistance value;
   second resistor means deposited on the substrate physically parallel to and closely adjacent the first resistor means, having a second resistance value substantially less than the first resistance value, having substantially the same length as the first resistor means, having a first end adjacent and coupled to the first end of the first resistor means and a second end adjacent the second end of the first resistor means, and coupled to the reference terminal, and wherein the immediately adjacent incremental lengths of the first resistor means and the second resistor means comprise substantially equal percentages of the respective total resistances thereof.

2. A feedback resistor arrangement according to claim 1 wherein the resistor means are deposited thick film resistors.

3. A feedback resistor arrangement according to claim 1 wherein the first resistor means is deposited on a first surface of the substrate and a second resistor means is deposited on a second surface of the substrate, immediately opposite the first resistor means.

4. A feedback resistor arrangement according to claim 1 wherein the first resistor means is deposited on a first surface of the substrate and the second resistor means comprises a resistor on either side of the first resistor means on the same surface of the substrate.

5. A feedback resistor arrangement according to claim 4 and wherein the second resistor means further includes another resistor deposited on a second surface of the substrate immediately opposite the first resistor means.

6. A method of forming a deposited resistor arrangement capable of providing wide bandwidth feedback for an amplifier, comprising the steps of:
   forming on a substrate a high value deposited resistor;
   forming at least one low value deposited resistor on said substrate, closely adjacent and physically parallel to said high value resistor and having substantially the same length as the high value resistor, each incremental length of the low value resistor having the same percentage of the total resistance thereof as does the immediately adjacent incremental length of the high value resistor of the total resistance thereof;
   coupling a first end of said high value resistor to the amplifier output;
   coupling a second end of said high value resistor to the amplifier input;
   coupling to the first end of said high value resistor the adjacent end of the low value resistor; and
   coupling the end of said low value resistor adjacent the second end of said high value resistor to a potential substantially equal to the potential on the amplifier input.

7. A method in accordance with claim 6 in which the resistors are formed by thick film deposition.

8. A method in accordance with claim 6 in which the high value resistor has a first dimension in the plane of the substrate substantially greater than a second dimension in said plane.

9. A method in accordance with claim 6 in which the high value resistor is formed on a first surface of the substrate and the low value resistor is formed on a second surface of the substrate, immediately opposite the high value resistor.

10. A method in accordance with claim 6 in which a low value resistor is formed on each side of the high value resistor on a first surface of the substrate and the low value resistors are connected in parallel.

11. A method in accordance with claim 10 and including the formation of a low value resistor on a second surface of the substrate, connected in parallel with the low value resistors on the first surface.

12. A wide bandwidth resistor arrangement comprising:
a substrate;
first elongated resistor means, deposited on a first surface of the substrate, having a predetermined length, and having a first resistance value; and
second resistor means deposited on the substrate, having a length substantially equal to the predetermined length, physically parallel to and closely adjacent the first resistor means, having a first end coupled to the adjacent end of the first resistor means, having a second end free of the adjacent end of the first resistor means, having a second resistance value substantially greater than the first resistance value, and having a resistance gradient along each increment of length which is a predetermined multiple of the resistance gradient along each immediately adjacent increment of length of the first resistor means.

13. A wide bandwidth resistor arrangement according to claim 12 wherein the first resistor means comprises a resistor portion on either side of the second resistor means on the first surface of the substrate.

14. A wide bandwidth resistor arrangement according to claim 12 wherein the first resistor means comprises a resistor on a second surface of the substrate and immediately opposite the second resistor means.

15. A wide bandwidth resistor arrangement according to claim 12 wherein the first resistor means comprises a resistor portion on either side of the second resistor means on the first surface of the substrate and a resistor portion on a second surface of the substrate and immediately opposite the second resistor means.

16. A wide bandwidth resistor arrangement according to claim 12 wherein the first and second resistor means comprise thick film resistors.

* * * * *